(12) United States Patent
Eckberg et al.

(10) Patent No.: US 7,228,888 B2
(45) Date of Patent: Jun. 12, 2007

(54) ROTATABLE LIQUID RESERVOIR FOR COMPUTER COOLING

(75) Inventors: Eric Alan Eckberg, Rochester, MN (US); James Dorance Gerken, Zumbro Falls, MN (US); Cary Michael Huettner, Rochester, MN (US); Roger Ray Schmidt, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/249,912

(22) Filed: Oct. 13, 2005

(65) Prior Publication Data
US 2007/0084588 A1   Apr. 19, 2007

(51) Int. Cl.
*F28D 7/10* (2006.01)
*F28D 15/00* (2006.01)

(52) U.S. Cl. ............ 165/80.4; 165/155; 165/104.32

(58) Field of Classification Search ......... 165/104.32, 165/80.4, 104.33, 80.2, 110, 155, 145; 361/698–700; 275/714–715; 62/259.2; 181/267–268
See application file for complete search history.

(56) References Cited

U.S. PATENT DOCUMENTS

| | | | |
|---|---|---|---|
| 2,640,557 A * | 6/1953 | Gaffney | 181/256 |
| 4,550,799 A * | 11/1985 | Flugger | 181/244 |
| RE32,092 E * | 3/1986 | Davis | 62/475 |
| 5,349,831 A * | 9/1994 | Daikoku et al. | 62/376 |
| 5,463,528 A * | 10/1995 | Umezawa | 361/699 |
| 5,491,363 A * | 2/1996 | Yoshikawa | 257/715 |
| 6,885,556 B2 * | 4/2005 | Kondo et al. | 361/699 |
| 6,942,018 B2 * | 9/2005 | Goodson et al. | 165/80.4 |
| 6,948,556 B1 * | 9/2005 | Anderson et al. | 165/80.4 |

* cited by examiner

*Primary Examiner*—Tho Duong
(74) *Attorney, Agent, or Firm*—Rabin & Berdo, P.C.

(57) ABSTRACT

In a system for liquid cooling of electronics, where the electronics are subject to rotation in space, a liquid coolant storage tank includes a degassing and vortex-preventing structure to allow bubbles to float to the surface of the liquid inside the tank, and also to prevent vortices from forming near the outlet from the tank. The structure includes nested tubes or conduits. An inner conduit extends from the inlet into the tank, and its open end is covered by a second conduit with a baffle across its end, so that the flow is directed by the baffle to flow back along the outside of the inner conduit, and inside of the outer conduit. Especially at the inlet, a third conduit with large perforations surrounds the open end of the outer conduit. Smaller perforations on the inner conduit at the outlet side discourage any vortex from forming there. Reversal of the liquid flow, and the gradual increase in flow cross section prevent surging inside the tank.

19 Claims, 2 Drawing Sheets

ROTATABLE LIQUID RESERVOIR FOR COMPUTER COOLING

CROSS-REFERENCE TO RELATED APPLICATIONS

There are no related applications.

BACKGROUND OF THE INVENTION

The continuing acceleration in computing power demand and supply, with ever-more transistors operating at ever-higher speeds, has brought about the need for liquid cooling of the computer chips. A chip today might contain hundreds of millions of transistors and emit two hundred watts of heat energy (twice the heat output of a 100-watt incandescent light bulb, emitted from a much smaller surface area), and the chip needs intense cooling. When chips are ganged and collected in complex devices, the amount of heat given off can be quite large, so that rooms full of electronic equipment become uncomfortably warm and are difficult to air-condition. Sometimes special air-conditioning must be arranged. For example, large areas of the floor have been converted to air-conditioning vents in some electronic installations Until recently, most electronic equipment, including most computer equipment, has been air-cooled. Air is free and air leaks are unimportant. However, air is a gas, therefore of low density, and therefore its cooling ability is limited. Liquids, being much denser than gasses, are more efficient at removing heat. Anyone who has sat in a cold bath knows that water is very chilling, even when it is at the same temperature as air that is comfortably cool, and water is said to be 3600 times more chilling than air. Besides possessing a greater heat capacity per unit of volume, liquids can boil to remove heat even faster than it can be removed by conduction to a liquid.

Electronic systems have been cooled by chilled water, but the fluid of choice may be a fluorine-based liquid, similar to the refrigerant FREON. Such liquid has the advantage of being an electrical insulator (water is not an insulator, and will cause short circuiting if it reaches the circuits). Fluorine-based liquids are available from the 3M company and come in different varieties having various physical properties. These fluorine-based liquids have low boiling points and, if they leak out of a system, will evaporate instantly instead of dripping onto any electronic components, which happens with water. These liquids also have low freezing points, and systems equipped with them need not be protected from freezing, for example during transport. Water, unlike most liquids, expands on freezing rather than contracting like most liquids, which is the cause of winter-time burst pipes.

Another advantage of fluorine-based liquids for cooling is proportionality. These liquids have physical properties that permit a system using them to be scaled down to a smaller size. When a water-cooled system is scaled down in size, the surface tension of the water can interfere with the functioning of the system. Viscosity is another physical property of a liquid that can become more or less influential when a device is scaled to a different size.

The conventional electronic cooling system includes a rack containing the computer and/or other electronic equipment to be cooled, a heat exchanger for removing heat from the liquid after it is heated by the electronics, a pump, and a storage tank. The heat exchanger, pump, tank, and connections together are referred to as a cooling distribution unit or CDU.

A tank is needed in a CDU system because the coolant liquid can leak out of the system, either through defects or because of coupling and uncoupling components. Because of this, some backup volume of the liquid must be provided, and the tank holds this extra volume of liquid. As liquid leaks out, it is replaced by air and/or gaseous vapor.

Another reason that a tank is needed is because of thermal expansion and contraction. Even if no fluid ever leaks out and no air ever gets in, the volume of the liquid will change, and one way to accommodate this change is to have a tank that is not quite full of liquid, but instead has some gas in it. The gas, being compressible, will allow for liquid volume change.

Because it is preferable to have a small amount of gas in a tank, and it is likely that a more-than-preferable amount of air or other gas will get into the system, the tank should be able to supply liquid even when there is a large amount of gas in the tank. The supply of liquid from the tank should be steady, without any interruptions and without air bubbles leaving the tank.

Because of the large amounts of heat to be removed from modern electronic equipment, the flow rate in a cooling system might be as much as ten gallons per minute, or even more. At such high flow rates, bubbles of any air or vapor that become entrained in the stream of coolant liquid are liable to be carried through the tank to the exit port and then to the pump. Bubbles in the pump can cause it to stop operating by vapor lock. Even a small bubble can also cause a temperature spike in the equipment to be cooled, because a small hot area in contact with a bubble cannot eliminate heat as well as adjacent areas that are immersed in cooling liquid.

Bubbles can enter with the liquid at the tank's entry port, or they can be generated inside the tank by turbulence caused by the high velocity of the liquid inside the tank and pump. Bubble formation is aggravated by low levels of the liquid in the tank, which increases the chances of air being entrained in surging or whirling liquid. Vortices (whirlpools or miniature tornadoes) tend to form at the exit port when the exit velocity is high. A vortex has a core of gas, and can suck the gas directly into the exit flow from the tank.

Cavitation is also a concern. Cavitation is the formation of bubbles of vacuum or the attenuated vapor of the liquid itself (as opposed to air or other gas which has entered the system). Cavitation, like the formation of vortices, is associated with high liquid flow rates. (When rowing a boat, cavitation can be seen next to the oar blades when the oars are forced through the water at high speed, as voids next to the oar; but cavitation does not appear at low speed.) Cavitation is harmful because the bubbles of cavitation collapse quickly soon after they are formed, and the sudden collapse creates a shock wave in the liquid that can damage pumps or other equipment.

Thus, there has been a need for a tank that does not generate or pass bubbles into the tank outlet pipe, even when the level of liquid in the tank drops.

In addition, there has been a need for a cooling distribution unit that can operate in various positions, as the electronic equipment to which it is attached is moved to various positions (for example, a computer might be laid over onto its side while running). In some circumstances, electronic equipment and its attached cooling system might even rotate continuously or rock intermittently, as on a boat that rolls but does not pitch significantly.

A bubble which is in a liquid reservoir can pass to the circulatory system if a change in orientation causes the bubble to extend to the reservoir outlet, where the bubble can get into the system. There has been a need for an electronic-cooling-system liquid reservoir that can be rotated during operation without introducing bubbles into the fluid circulation system or changing its operation, and this need has not been met by the conventional rectangular tank with inlet and outlet arranged in random positions.

The traditional tank, with a simple inlet orifice and a simple outlet orifice, does not meet these needs. If the outlet is uncovered, gas will be sucked directly into the system; vortices are certain to form at high flow rates; and bubbles may be sucked into the exit orifice even if it is located at the bottom of the tank.

SUMMARY OF THE INVENTION

The invention has several objects, including (among others): eliminating any bubbles that enter the tank of a liquid cooling system for cooling electronic gear; not entraining additional bubbles into the liquid flow, especially through vortices formed near the outlet of the tank; avoiding cavitation; and operation of the system at any angle of orientation.

The invention eliminates bubbles in part by the use of nested conduits or tubes, with the end of a smaller, inner conduit being disposed within the open end of a larger outer conduit that is closed at the other end by a baffle or a wall of the tank. This structure forces the liquid, on entering or exiting the tank, to reverse its direction of flow. There may be two, three, or more nesting conduits.

Preferably, at least some of the conduits have perforations (small through-holes) in their walls. The perforations leak, due to the pressure difference between the inside and outside of the conduit, so that the flow is gradually slowed as it flows into the tank and is accelerated as it flows out. This is beneficial because the liquid inside the tank should slow to the point where bubbles can rise to the surface. The perforations in the inner conduits are preferably small to allow liquid to leak out.

The outer conduit may have larger perforations which pass bubbles more easily than smaller perforations. As liquid entering the tank passes out of the end of the smaller conduit, reverses direction, and passes through the larger conduit, it is moving slowly enough that some smaller bubbles will pass through the perforations.

Vortices are liable to form at the exit port. Anyone who has watched water drain from a tub knows that a vortex can move about and turn corners. But vortices will have difficulty passing through a perforated surface. A vortex encountering a perforated surface encounters both flow obstruction and energy absorption, both of which will tend to destroy the vortex.

The invention can provide for a gradual increase in the cross-sectional area perpendicular to the flow, by choosing the diameters of the conduits correctly, by making them conical or otherwise divergent in shape, and by including perforations.

The invention contemplates a method and a system, where, in a coolant tank for an electronics-cooling system including a pump and a tank for a cooling liquid, wherein the system is rotatable around at least one axis of rotation, and wherein the tank includes a tank wall (with ports through the tank wall including an inlet port and an outlet port), and a degassing and vortex-preventing structure. The degassing and vortex-preventing structure includes an inner conduit including a first end and a second end, with the inner conduit being attached to the tank wall at the first end and the second end being located in the interior of the tank. An outer conduit surrounds a portion of the inner conduit, the surrounded portion including the second end of the inner conduit. A baffle is across an inner end of the outer conduit so that fluid flow into or out of the port passes through the inner conduit past the second end and, directed by the baffle, passes between the outer conduit and the portion of the inner conduit that is surrounded by the outer conduit.

BRIEF DESCRIPTION OF THE DRAWING FIGURES

DETAILED DESCRIPTION OF THE PREFERRED EMBODIMENTS

Figure 1:
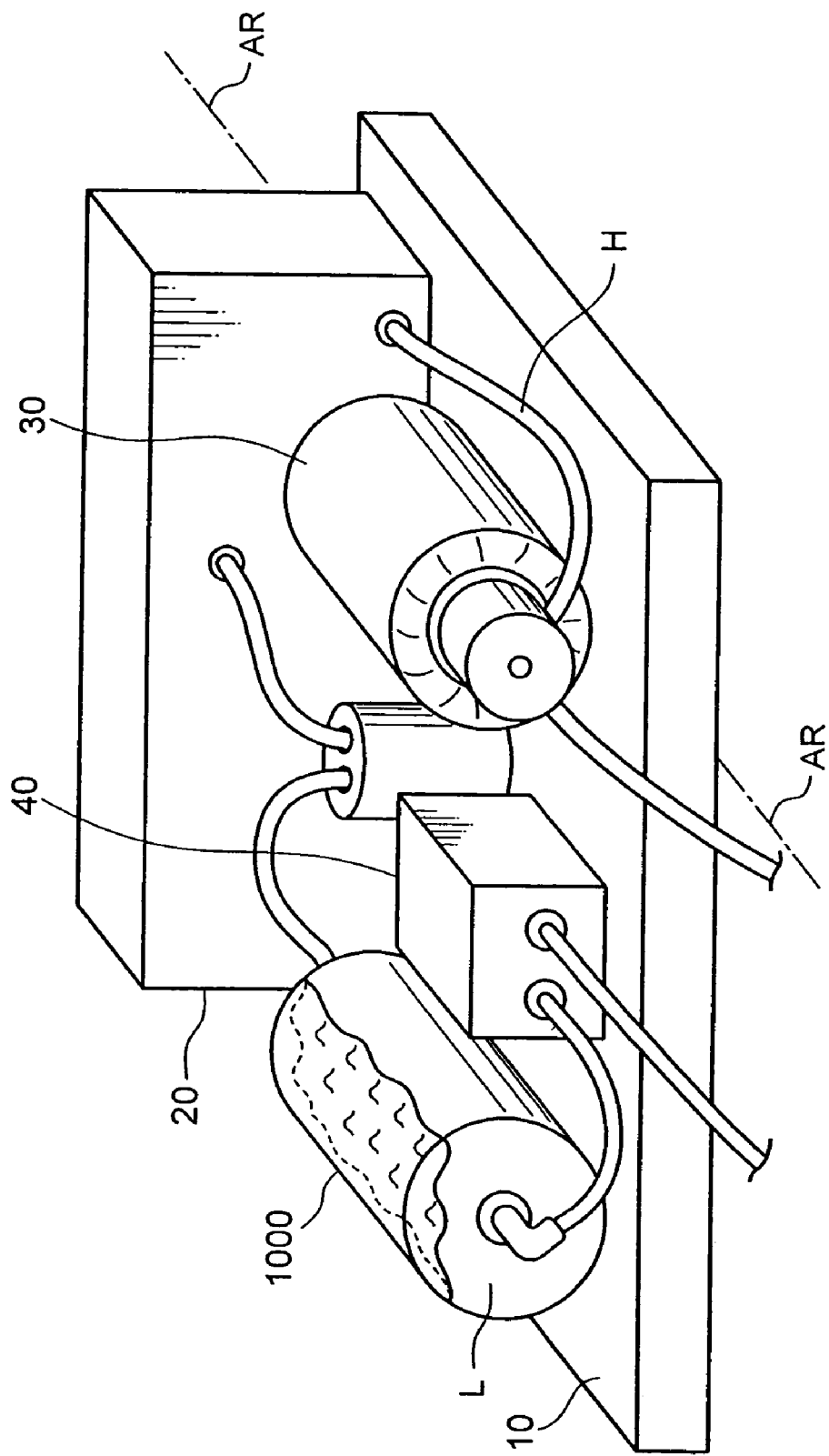
FIG. 1 is a semi-schematic overview of the system of the invention.

The system of the invention is depicted in FIG. 1. A rack 10 includes electronics 20 that generates heat and is cooled by a cooling liquid L. The system includes a pump 30, a heat exchanger 40, and various hoses H leading between these components. A tank 1000 contains the cooling liquid L. There are two ports into the tank 100, an inlet port at one end and an outlet port at the other end. Inside the tank 1000 is a degassing and vortex-preventing structure which is described below. Other components, such as an expansion chamber or a filter, can also be employed. The connections of the hoses in FIG. 1 are only exemplary and any sort of liquid path through the system can be used.

The system shown in FIG. 1 is designed to operate under rotation. An axis of rotation AR is shown in FIG. 1.

Figure 2:
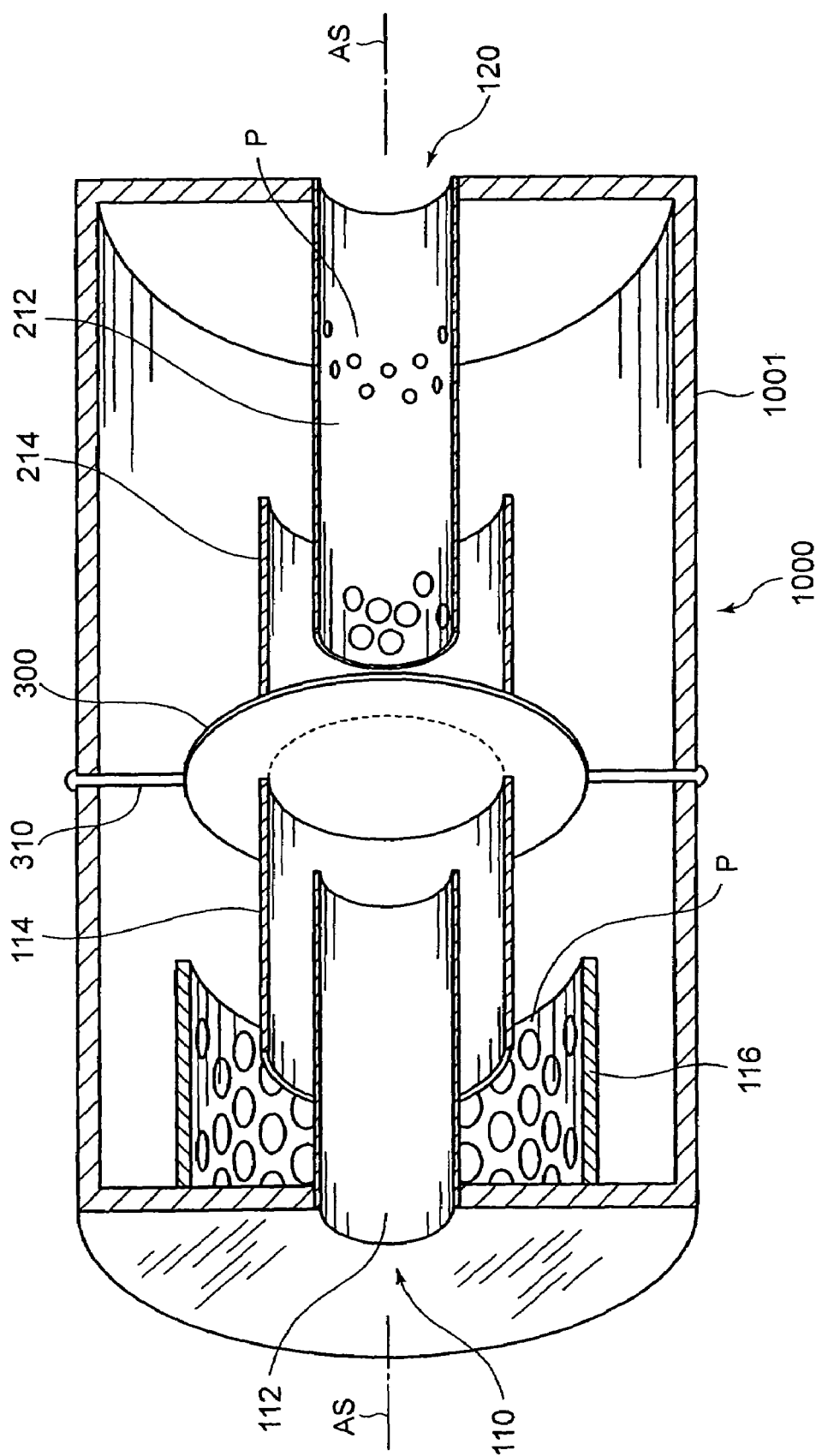
FIG. 2 is a mostly cross-sectional view of a tank of the invention.

FIG. 2 best shows the degassing and vortex-preventing structure in a partially cross-sectional view, as if the tank 1000 were sawn down a cylindrical axis of symmetry AS (the axis AS is discussed below), with the exception of the baffle 300, described later, which is shown in perspective view. The hoses H and liquid L are omitted from FIG. 2 for clarity. A possible diameter for the cylindrical tank 1000 shown in FIG. 2 is ten inches, and an exemplary capacity is 4–5 U.S. gallons.

The degassing and vortex-preventing structure includes nested conduits 112, 114, 116, 212, 214. One inner conduit 112 has a first end fastened to the tank wall 1001 at the inlet port 110 (at left in the drawing in FIG. 2) so that liquid entering the tank passes through the inner conduit 112 and out through the second end located in the interior of the tank. At the exit port is another inner conduit 212, which preferably has numerous small perforations P. These perforations P may be on the order of one tenth of an inch across, or larger or smaller depending on the circumstances. The perforations may cover any portion of conduit; representative portions of conduit 212 are shown covered with perforations P in FIG. 2, but the illustrated portions only indicate that some portion may be covered, and do not limit the invention.

At each of the inlet and the outlet is another, outer conduit, 114 and 214, surrounding the portion of the inner conduit, 112 and 212 respectively, which protrudes into the tank. Preferably, the second end of the inner conduit 112 or 212 is located inside the length of the outer conduit 114, 214. The liquid L spewing from the inlet 110 (liquid not shown in FIG. 2), and being drawn to the outlet 120, would go more or less directly from one conduit to another, carrying bubbles into the outlet 120, if no obstructions were there. To prevent such short-circuit flow, the degassing and vortex-preventing structure preferably includes a baffle 300 right across the innermost ends of the outer conduits 114 and 214. The presence of this baffle 300 forces the liquid to go in a sinuous path, reversing direction at the open second end of the inner conduit 112 or 212.

In the illustrated embodiment, the baffle 300 is shown mounted to the tank wall 1001 by a spider 310 which holds the baffle in position inside the tank 1000. The spider 310 may have two or more arms (only two are shown in FIG. 2). Preferably, the outer conduits 114, 214 are mounted on the baffle 300. Alternative constructions are possible. For example, the conduit/baffle/conduit structure could be replaced by two separate closed-ended outer conduits (like opened tin cans), where each could, if desired, be mounted separately to the tank wall 1001, to the inner conduits 112, 114, or otherwise.

On the inlet side of the tank 100 is shown a third conduit 116, surrounding a portion of the outer conduit 114. It will be seen in FIG. 2 that the third conduit guides the liquid to flow in a sinuous path. This third conduit 116, as illustrated, preferably includes larger-diameter perforations P which can be of the order of 0.4 inches across, or less or more. This third conduit 116 preferably can be mounted directly onto the wall 1001 of the tank 1000. Although the third conduit 116 is shown on the inlet 110 and not on the outlet 120 (this is the preferred construction), the number of nested conduits is not limited at either or both of the inlet 110 and outlet 120.

Preferably, the perforations on the outlet conduit 212 vary in size and/or density (number of perforations per unit area of the conduit) with distance from the outlet 120. Most preferably, the perforation diameter increases with distance from the outlet 120, so that the total area available for liquid flow through a unit area wall of the conduit (flux area density) increases with distance from the outlet 120. This progression has been found to discourage the formation of vortices. The perforations P need not be uniform even within a small area on the conduit.

The average center-to-center spacing of the perforations, which affects the perforation density and therefore the fluid flux area density, can either decrease or increase with distance from the outlet 120. The fluid flux area density can be constant, increase, or decrease with distance from the outlet 120. Also, the perforations preferably can be absent entirely (fluid flux area density equal to zero) adjacent to the outlet 120.

FIG. 2 shows the perforations P in partial view for drafting convenience (i.e. some are omitted from the drawing), but illustrates an example in which the perforations can be smaller and farther apart (by either edge-to-edge or center-to-center distance) at the end of the conduit 212 nearer to the outlet 120, and larger and closer together toward the other end. FIG. 2 also exemplifies that a circumferential band near the outlet 120 can be devoid of perforations, and illustrates that the fluid flux area density increases with distance from the outlet 120.

Circumferential perforation variations can also be employed in this invention, in addition to or instead of the axial variations described above. For example, on the conduit 116 on the inlet side the perforations P could be larger in diameter on the bottom side than on the top side (not shown), which would be useful for allowing bubbles to escape the flow. This variation would be especially useful if the amount of rotation about the axis AR were limited in angular extent.

Variations in the perforation characteristics such as those described above can also be employed in the inlet conduits 112, 114, and/or 116, if desirable (not shown in the drawing).

All the conduits are preferably cylindrical, but can be of any other shape in cross section. Also, the conduits may be conical, which may help in bubble separation especially with liquids of low surface tension.

FIG. 2 shows an exemplary preferred shape of the tank 100, namely, cylindrical. The drawing also shows that the entire structure is symmetrical about an axis of symmetry AS which is generally parallel to the axis of rotation AR shown in FIG. 1. Although the conduits can be placed eccentrically off the axis of symmetry AS and can be tilted, it is preferred that the degassing and vortex-preventing structure be axially placed and oriented to extend parallel to the axis of symmetry AS (and therefore to the axis of rotation AR), for the following reason: as the cooling distribution unit is turned, the level of the liquid does not change relative to the degassing and vortex-preventing structure, and therefore the performance is constant even when the unit is rotated.

The invention includes the entire system of FIG. 1, as well as the tank of FIG. 2, and a method for cooling electronic equipment using the cooling distribution unit (tank, pump, heat exchanger and associated equipment.

Other structures not shown in FIG. 2 can be incorporated into the invention, such as the conical conduits mentioned above. If these are nested with the larger ends inserted into the surrounding conduits, then the divergence will lead to a gradually decreasing velocity. Also, a half-cylinder can be added.

The perforations P need not be formed as holes in a sheet. The conduits can also employ woven-wire structures, felts, roughened surfaces, and other structures to absorb energy from flowing liquid.

The invention contemplates rotations about two different axes (e.g., tumbling). When there are two non-parallel axes of rotation (that is, the cooling distribution unit rotates around the axis AR and also another axis (not shown) which is skew to the axis AR or intersects it at an angle, then the tank is preferably spherical. In this case, when the inlet and the outlet are placed at opposite poles of the sphere they can end up at the nadir and zenith, respectively or conversely. If the port at the zenith is the outlet, then gas is likely to get into the system if the conduits are open to the gas. However, the structure of this invention can overcome this problem by using nested cylinders. It will be understood that in a spherical tank the level of liquid above the center point is constant, while the angle of the liquid surface changes. By modifying the degassing and vortex-preventing structure appropriately with some portions remaining submerged, vortex formation can be reduced and entrained bubbles can rise to the liquid surface.

A cylindrical tank of square aspect ratio (length equal to diameter) is an approximation to a sphere, in the sense that the level of liquid above the center point is the same whether the tank's axis is horizontal or vertical, and the liquid level will not vary appreciably at intermediate angles. Therefore, structures similar to those described above can be incorporated into a cylindrical tank of square aspect ratio to approximate the performance of a spherical tank having the same degassing and vortex-preventing structures.

Fluorine-based liquids are preferred for the invention, due to their advantages mentioned above, and especially for scaling-down the invention. However, any liquid at all can be used in the invention.

We claim:

1. A coolant tank for a liquid-cooling system, comprising: a tank wall, the tank wall having an inlet port and an outlet port; and a degassing and vortex-preventing structure, including:
  an inner conduit having a first end attached to one of the ports of the tank wall, and a second end located in an interior of the tank;
  an outer conduit having a first end and a second end, and surrounding the second end of the inner conduit; and
  a baffle covering the first end of the outer conduit;
  wherein the inner conduit and the outer conduit lack perforations when the one of the ports is the inlet port; and
  wherein the tank is symmetrical about an axis of symmetry and the inlet port and the outlet port are both concentric with the axis of symmetry;
  whereby liquid flow into or out of one of the ports passes through the inner conduit past the second end and passes between the outer conduit and the portion of the inner conduit that is surrounded by the outer conduit.

2. The coolant tank according to claim 1, wherein the inner conduit includes perforations when the one of the ports is the outlet port.

3. The coolant tank according to claim 1, wherein the degassing and vortex-preventing structure further comprises a third conduit surrounding a portion of the outer conduit;
  whereby liquid flow passes between the third conduit and that portion of the outer conduit that is surrounded by the third conduit.

4. The coolant tank according to claim 3, wherein the tank wall closes one end of the third conduit and the tank is greater in diameter than the third conduit.

5. The coolant tank according to claim 3, wherein the third conduit includes perforations.

6. The coolant tank according to claim 1, wherein the baffle is spaced apart from the inside of the tank wall.

7. The coolant tank according to claim 2, wherein a density of the perforations varies along a length of the conduit by varying at least one of an average perforation size and an average perforation spacing.

8. The coolant tank according to claim 7, wherein the density of the perforations increases along the length of the conduit in a direction away from the tank wall.

9. The coolant tank according to claim 1, wherein the baffle is attached to the first end of the outer conduit.

10. The coolant tank according to claim 1, wherein the baffle is attached to the first end of the outer conduit.

11. A system, rotatable around at least one axis of rotation, comprising: electronic equipment generating heat; a cooling liquid for cooling the electronic equipment; and a pump and a tank for the cooling liquid; wherein the tank includes a tank wall, ports through the tank wall further comprising an inlet port and an outlet port, and a degassing and vortex-preventing structure; wherein the degassing and vortex-preventing structure further comprises:
  an inner conduit including a first end and a second end, the inner conduit being attached to the tank wall at the first end and the second end being located in the interior of the tank;
  an outer conduit surrounding a portion of the inner conduit, the portion including the second end of the inner conduit; and
  a baffle across an inner end of the outer conduit, the baffle being spaced apart from the inside of the tank wall;
  wherein the tank is symmetrical about an axis of symmetry and the inlet port and the outlet port are both concentric with the axis of symmetry;
  whereby liquid flow into or out of the port passes through the inner conduit past the second end and, directed by the baffle, passes between the outer conduit and the portion of the inner conduit that is surrounded by the outer conduit.

12. The system according to claim 11, wherein the inlet port and the outlet port are disposed at opposing ends of the tank.

13. The system according to claim 11, wherein the system further comprises a third conduit surrounding a portion of the outer conduit;
  whereby fluid flow into or out of the port passes between the third conduit and that portion of the outer conduit that is surrounded by the third conduit.

14. The system according to claim 13, wherein the tank wall closes one end of the third conduit.

15. The system according to claim 13, wherein the third conduit includes perforations.

16. The system according to claim 11, wherein at least one conduit comprises perforations.

17. The system according to claim 16, wherein a density of the perforations varies along a length of the conduit by varying at least one of an average perforation size and an average perforation spacing.

18. The system according to claim 17, wherein the density of the perforations increases along the length of the conduit in a direction away from the tank wall.

19. A method for cooling electronics mounted on a rack that is rotatable around at least one axis of rotation, the method comprising:
  mounting on the rack a cooling system including a pump and a tank for a cooling liquid; wherein the tank includes a tank wall, ports through the tank wall further comprising an inlet port and an outlet port, and a degassing and vortex-preventing structure;
  wherein the degassing and vortex-preventing structure comprises:
  an inner conduit including a first end and a second end, the inner conduit being attached to the tank wall at the first end and the second end being located in the interior of the tank;
  an outer conduit surrounding a portion of the inner conduit, the portion including the second end of the inner conduit; and
  a baffle across an inner end of the outer conduit, the baffle being spaced apart from the inside of the tank wall;
  wherein at least one conduit comprises perforations varying along a length of the conduit;
  whereby fluid flow into or out of the port passes through the inner conduit past the second end and, directed by the baffle, passes between the outer conduit and the portion of the inner conduit that is surrounded by the outer conduit.

* * * * *